United States Patent
Kang

(10) Patent No.: US 7,599,243 B2
(45) Date of Patent: *Oct. 6, 2009

(54) SENSE AMPLIFIER OVER DRIVER CONTROL CIRCUIT AND METHOD FOR CONTROLLING SENSE AMPLIFIER OF SEMICONDUCTOR DEVICE

(75) Inventor: Khil-Ohk Kang, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 336 days.

This patent is subject to a terminal disclaimer.

(21) Appl. No.: 11/528,339

(22) Filed: Sep. 28, 2006

(65) Prior Publication Data

US 2007/0070784 A1 Mar. 29, 2007

(30) Foreign Application Priority Data

| Sep. 28, 2005 | (KR) | ................ | 10-2005-0090837 |
| Sep. 29, 2005 | (KR) | ................ | 10-2005-0090911 |
| Dec. 28, 2005 | (KR) | ................ | 10-2005-0132504 |
| Dec. 28, 2005 | (KR) | ................ | 10-2005-0132586 |

(51) Int. Cl.
*G11C 8/00* (2006.01)

(52) U.S. Cl. ................ 365/230.06; 365/185.23; 365/185.21

(58) Field of Classification Search ............ 365/230.06, 365/185.23, 185.21, 189.11, 207, 241
See application file for complete search history.

(56) References Cited

U.S. PATENT DOCUMENTS

| 6,043,685 | A | 3/2000 | Lee |
| 6,477,100 | B2 | 11/2002 | Takemura et al. |
| 6,487,133 | B2 | 11/2002 | Wada et al. |
| 6,519,199 | B2 * | 2/2003 | Ku ................ 365/222 |
| 6,754,122 | B2 | 6/2004 | Wada et al. |
| 6,853,593 | B1 | 2/2005 | Bae |
| 7,423,911 | B2 * | 9/2008 | Kang ............. 365/185.23 |
| 2002/0080677 | A1 * | 6/2002 | Watanabe et al. ....... 365/233 |
| 2004/0218447 | A1 | 11/2004 | Yun |
| 2004/0233754 | A1 | 11/2004 | Kwon |
| 2005/0135172 | A1 | 6/2005 | Kim |
| 2005/0249000 | A1 | 11/2005 | Kwack et al. |
| 2007/0070726 | A1 * | 3/2007 | Jang et al. .......... 365/189.11 |

FOREIGN PATENT DOCUMENTS

| KR | 1999-0069267 | 9/1999 |
| KR | 10-2002-0053491 A | 7/2002 |
| KR | 10-2002-0057280 A | 7/2002 |
| KR | 10-2003-0047013 A | 6/2003 |

* cited by examiner

*Primary Examiner*—Dang T Nguyen
(74) *Attorney, Agent, or Firm*—Mannava & Kang, P.C.

(57) ABSTRACT

A semiconductor memory device includes a bit line sense amplifying block that senses and amplifies bit line data. A first driving block drives a pull up power line of the bit line sense amplifying block using a voltage applied to a normal driving voltage terminal. A second driving block drives the normal driving voltage terminal using an over driving voltage. An over driving signal generation block generates an over driving signal that defines an over driving interval in response to an active command. An external power supply voltage level detection block detects a voltage level of the external power supply voltage. A selective output block selectively outputs the over driving signal in response to an output signal of the external power supply voltage level detection block, wherein an output signal of the selective output block controls the second driving block.

18 Claims, 10 Drawing Sheets

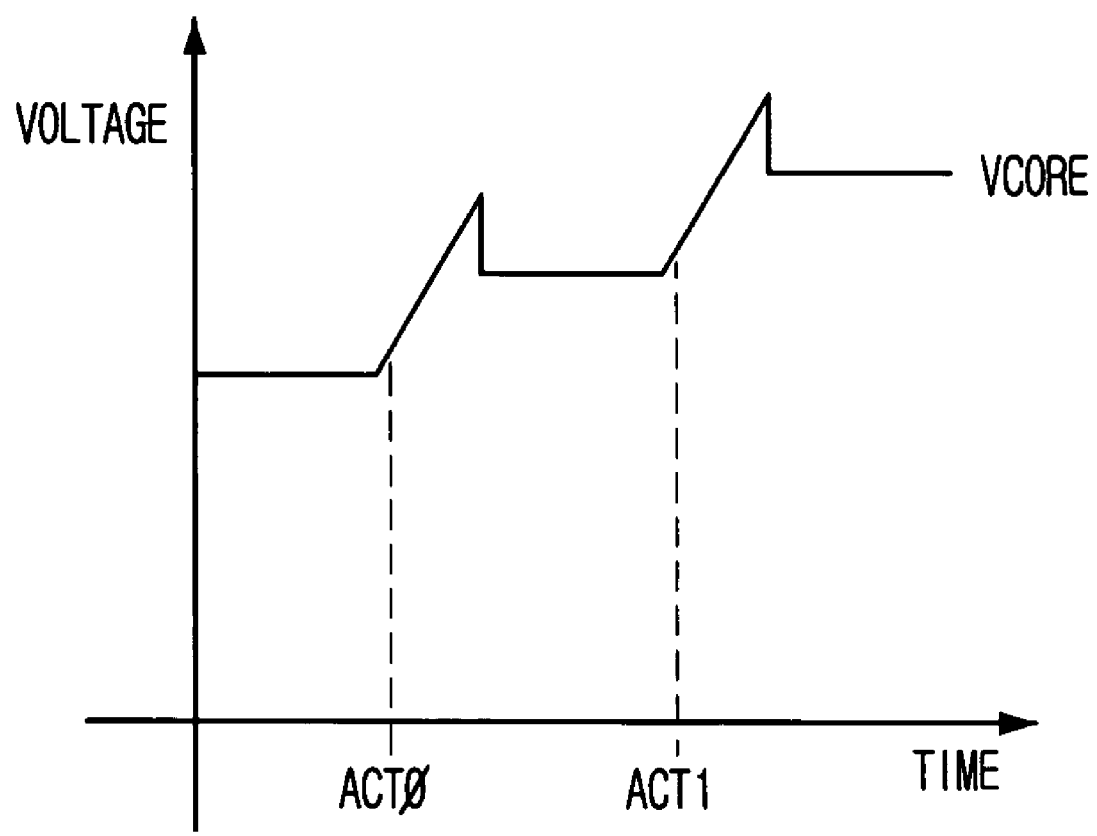

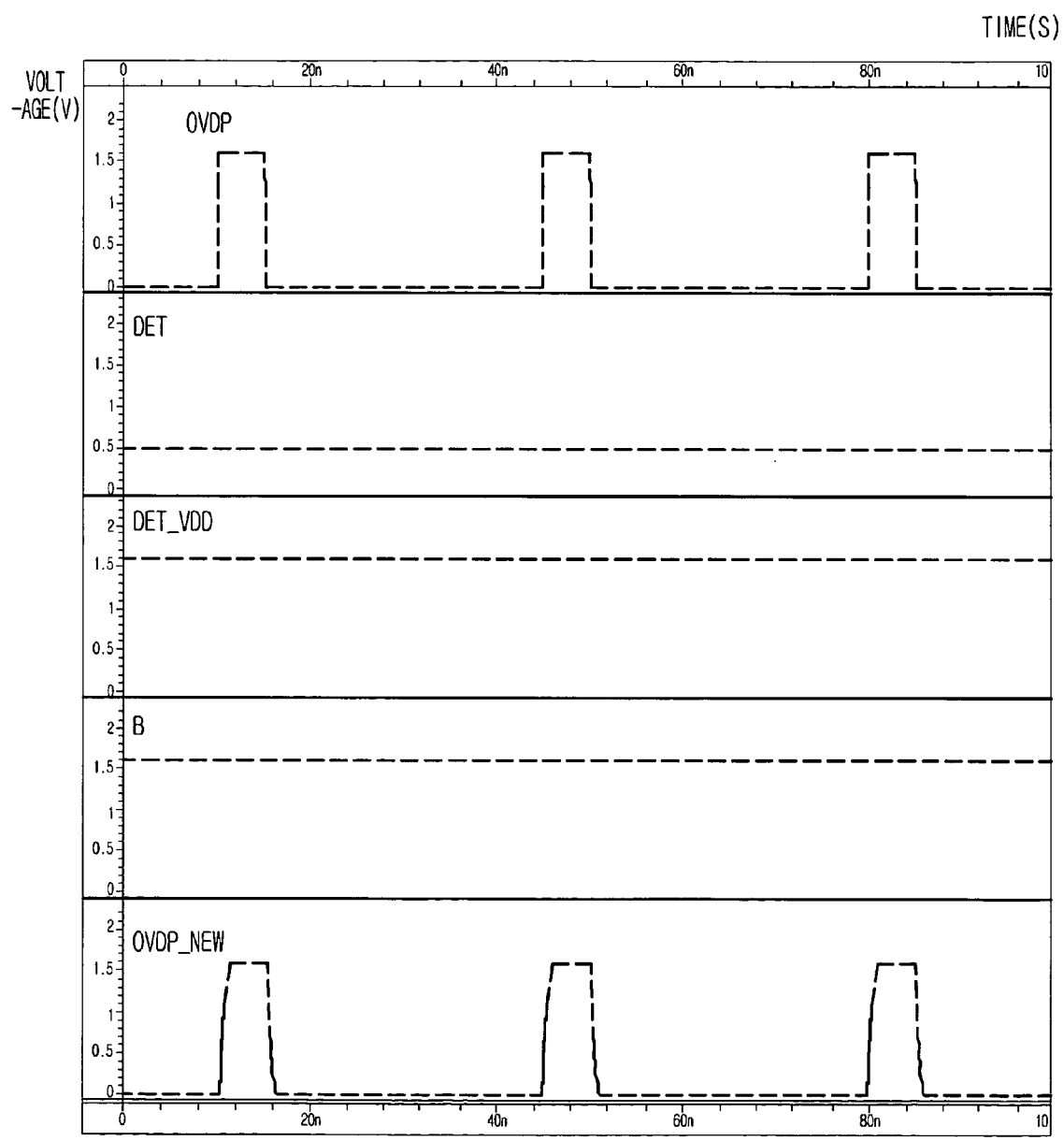

SENSE AMPLIFIER OVER DRIVER CONTROL CIRCUIT AND METHOD FOR CONTROLLING SENSE AMPLIFIER OF SEMICONDUCTOR DEVICE

FIELD OF THE INVENTION

The present invention relates to a semiconductor memory device, and more particularly, to a semiconductor memory device designed to control a bit line over driving.

BACKGROUND

As the line widths and cell sizes of semiconductor memory devices have been progressively scaled down, many researchers have focused on developing a memory device that can operate at low power supply voltage. Hence, a layout technology that can provide functions required for low operation voltage conditions is necessary.

Currently, an internal voltage generator that generates an internal voltage after being supplied with an external power supply voltage is installed within a semiconductor memory device to provide a voltage necessary for the operation of the semiconductor memory device. In those memory devices using bit line amplifiers such as dynamic random access memories (DRAMs), a core voltage is a voltage corresponding to a logic high of a data signal.

Once a group of word lines selected by a row address is activated, voltages corresponding to respective stored data of multiple memory cells that are connected to the selected word lines are supplied to bit lines, and the bit line amplifiers sense the voltages supplied to the bit lines and amplify the sensed voltages. Thus, many of the bit line amplifiers operate simultaneously to amplify the voltages supplied to the bit lines. However, a large amount of current is dissipated from a terminal of the core voltage that drives the bit line sense amplifiers, and a core voltage level decreases. When the core voltage level continues to decrease, it is often difficult to amplify the voltages supplied to the bit lines for a short period using the core voltage. In other words, the sensing rates of the bit lines become decreases.

Hence, during an initial stage of operating the bit line sense amplifiers (i.e., after the memory cells and the bit lines share charges), the bit line sense amplifiers sense and amplify the voltages amplified to the bit lines using a higher voltage (typically an external power supply voltage VDD) than the core voltage. This method is often called "over driving mode."

FIG. 1 illustrates a simplified diagram of a typical control circuit for a bit line sense amplifier block BLSA.

The bit line sense amplifier block BLSA includes a pull up power line RTO and a pull down power line SB. First to third driver transistors M1, M2 and M3 are provided to drive the pull up power line RTO and the pull down power line SB. The second driver transistor M2 is used to drive the pull up power line RTO using a core voltage VCORE in response to a pull up power line driving control signal SAP. The third driver transistor M3 is to drive the pull down power line SB using a ground voltage VSS in response to a pull down power line driving control signal SAN. In response to an over driving signal OVDP, the first driver transistor M1 supplies an external power supply voltage VDD to the pull up power line RTO through the second driver transistor M2.

An over driving signal generation block generates the over driving signal OVDP in response to an active command ACT.

The first and second driver transistors M1 and M2 may be replaced with P-type channel metal-oxide semiconductor (PMOS) transistors.

Supplying the active command ACT activates word lines, and data stored in cells are transferred to respective bit line pairs. After a certain period, the pull up power line driving control signal SAP and the pull down power line driving control signal SAN are activated as a logic high level. At this time, the over driving signal OVDP that has activated as a logic high level in response to the active command ACT before the activation of the pull up power line driving control signal SAP and the pull down power line driving control signal SAN instructs the over driving of the pull up power line RTO for a predetermined period. More specifically, when the pull up power line driving control signal SAP, the pull down power line driving control signal SAN and the over driving signal OVDP are activated as the logic high level, the first to third driver transistors M1, M2 and M3 are turned on to drive the pull down power line RTO using the external power supply voltage VDD and to drive the pull up power line SB using the ground voltage VSS.

After the elapse of a certain time, the over driving signal OVDP is inactivated as a logic low level, and thus, the first driver transistor M1 is turned off and the pull up power line RTO is driven using only the core voltage VCORE.

FIGS. 2A to 2C illustrate graphs of voltage level changes in a terminal of a core voltage VCORE according to operation conditions for a bit line sense amplifier block in a time basis.

Particularly, FIG. 2A illustrates a graph of the voltage level change in the core voltage terminal during operation of the bit line sense amplifier block that does not perform a bit line over driving operation. After an active command ACT0 is supplied, the voltage level of the core voltage terminal drops down abruptly. For reference, if an external power supply voltage VDD applied to DRAMs has a specific range between 1.7 V and 1.9 V, a semiconductor memory device should operate normally not only at a range of the external power supply voltage VDD between 1.7V to 1.9V, but also at a range of the external power supply voltage VDD less than 1.7 V or greater than 1.9 V but up to a certain level.

FIG. 2B illustrates a graph of the voltage level change in the core voltage terminal during operation of the bit line sense amplifier block that performs the bit line over driving operation under the condition of low external power supply voltage VDD. Due to the over driving operation, the core voltage terminal can maintain a stabilized voltage level.

FIG. 2C illustrates a graph of the voltage level change in the core voltage terminal during operation of the bit line sense amplifier block that performs the bit line over driving operation under the condition of high external power supply voltage VDD. Since a voltage difference between the core voltage VCORE and the external power supply voltage VDD is large, performing the over driving operation in response to the active commands ACT0 and ACT1 causes a voltage level of the core voltage terminal to increase abruptly. Also, when active commands are input consecutively, the voltage level of the core voltage VCORE increases further due to the charges remaining in the core voltage terminal in response to the precedent active command.

In such a case, the selected word line is driven using a high voltage VPP, which is an internal voltage higher than the external power supply voltage VDD, and the bit line has an over driving voltage whose level is higher than a normal level of the core voltage VCORE. As a result, in a cell transistor having a gate connected to a word line and a source connected to a bit line, a voltage Vgs between the gate and the source of the cell transistor is usually reduced. The reduction in the gate-source voltage Vgs of the cell transistor may impair reliability of a read or write operation, and thus, a semiconductor memory device may operate erroneously.

SUMMARY OF THE INVENTION

It is, therefore, an object of the present invention to provide a semiconductor memory device that can reduce an excessive increase in a voltage level of a core voltage terminal due to an over driving operation executed during operation of a bit line sense amplifier block under the condition of high external power supply voltage and a driving method thereof.

In accordance with an aspect of the present invention, there is provided a semiconductor memory device, including: a bit line sense amplifying block sensing and amplifying data on bit lines; a first driving block driving a pull up power line of the bit line sense amplifying block using a voltage applied to a normal driving voltage terminal; a second driving block driving the normal driving voltage terminal using an over driving voltage; an over driving signal generation block generating an over driving signal that defines an over driving interval in response to an active command; an external power supply voltage level detection block detecting a voltage level of an external power supply voltage; and a selective output block selectively outputting the over driving signal in response to an output signal of the external power supply voltage level detection block, wherein an output signal of the selective output block controls the second driving block.

In accordance with another aspect of the present invention, there is provided a driving method of a semiconductor memory device, including: driving a pull up power line of a bit line sense amplifying block using a voltage applied to a normal driving voltage terminal; generating an over driving signal that defines an over driving interval in response to an active command; detecting a voltage level of an external power supply voltage to selectively output the over driving signal; selectively outputting the over driving signal in response to the detection result, wherein if the over driving voltage is lower than a predetermined voltage, the over driving signal is enabled, and if the over driving voltage is higher than the predetermined voltage, the over driving signal is disabled; and driving the normal driving voltage terminal using the over driving voltage in response to the over driving signal.

BRIEF DESCRIPTION OF THE DRAWINGS

The above and other objects and features of the present invention will become better understood with respect to the following description of the exemplary embodiments given in conjunction with the accompanying drawings, in which:

FIGS. 2A to 2C are graphs of voltage level changes in a core voltage terminal according to operation conditions for a bit line sense amplifier block in a time basis;

FIGS. 5A and 5B are timing diagrams of the circuit illustrated in FIG. 4;

DETAILED DESCRIPTION OF THE INVENTION

A semiconductor memory device based on over driving scheme and driving method thereof in accordance with exemplary embodiments of the present invention will be described in detail with reference to the accompanying drawings.

Figure 3:
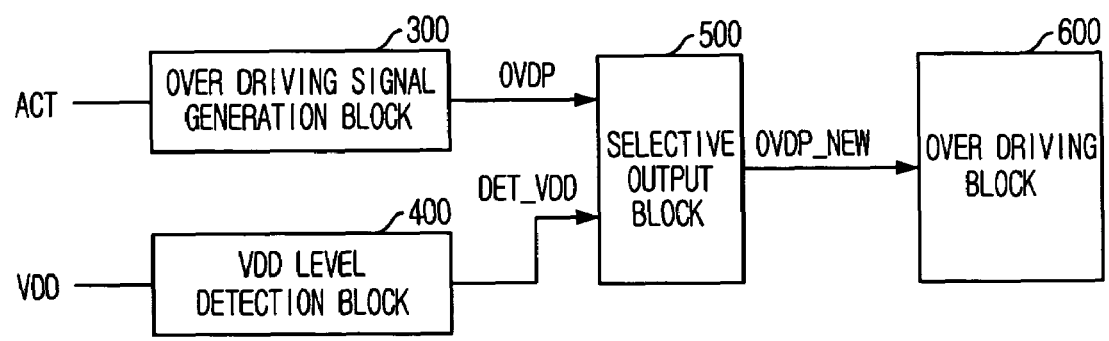
FIG. 3 is a simplified block diagram of a semiconductor memory device operating according to an over driving scheme in accordance with an embodiment of the present invention.

FIG. 3 is a simplified block diagram of a semiconductor memory device operating according to an over driving scheme in accordance with an embodiment of the present invention.

Figure 1:
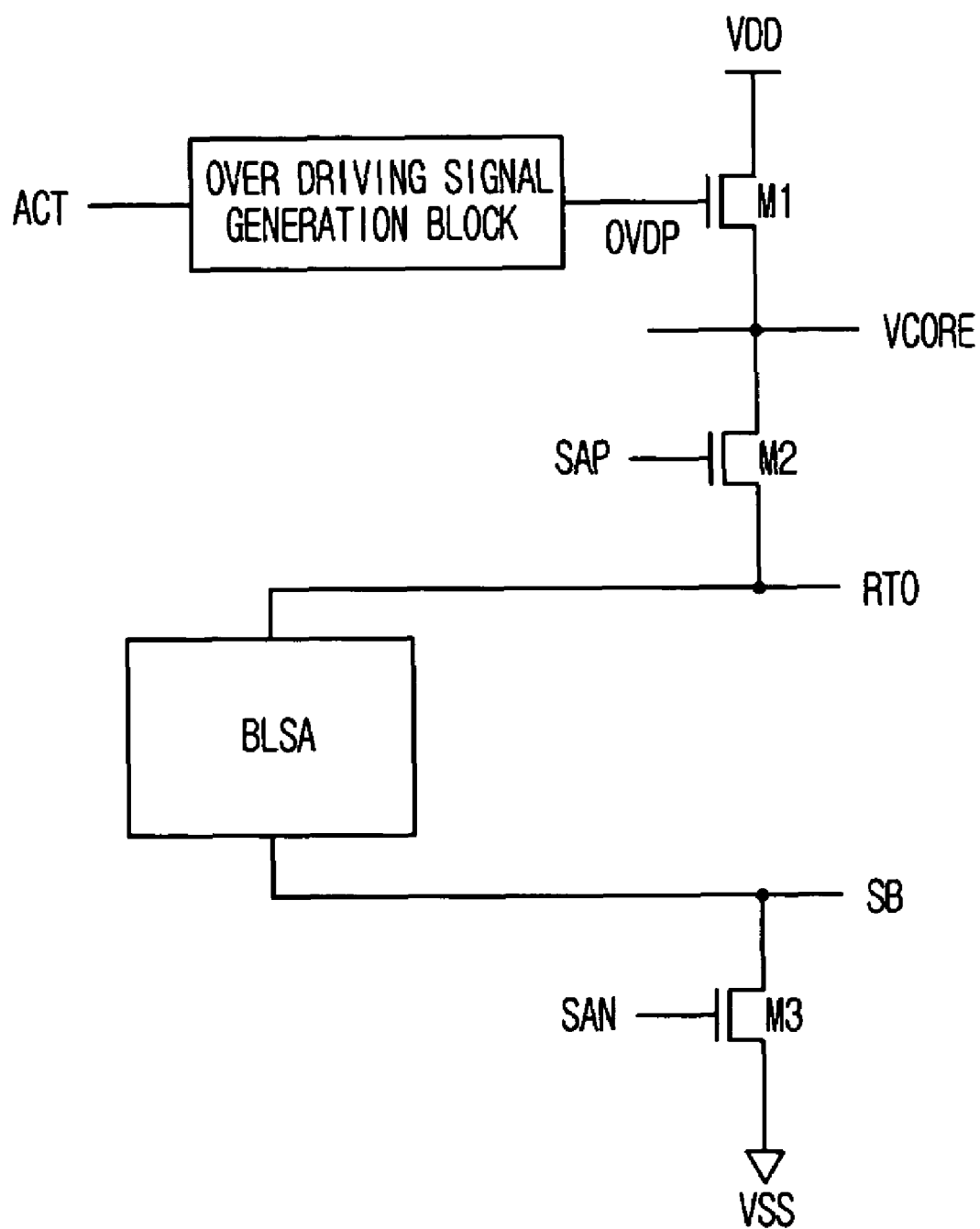
FIG. 1 is a simplified diagram of a typical bit line sense amplifier control circuit.
Figure 2A:
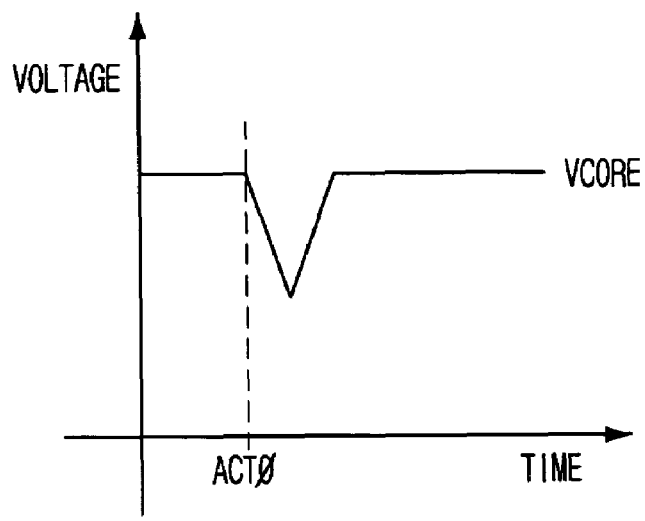
Figure 2B:
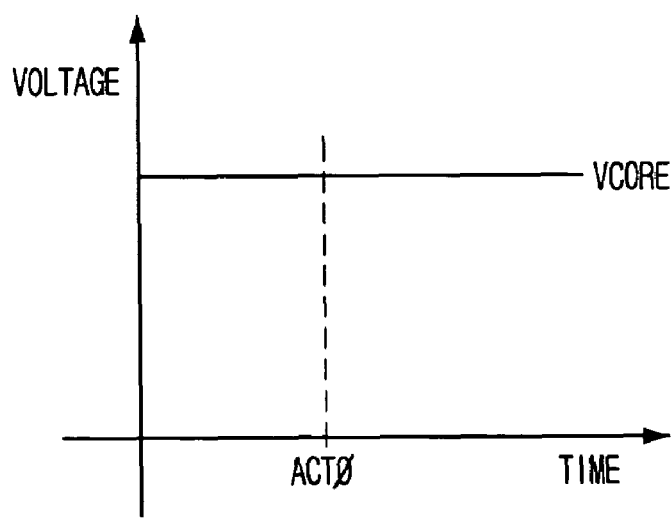

The semiconductor memory device according to the present embodiment uses a blind driver type over driving scheme. In the blind driver type over driving scheme, a normal driver (not shown) is used to drive a pull up power line RTO of a bit line sense amplifier block using a voltage applied to a core voltage terminal, and an over driver is used to drive the core voltage terminal using an external power supply voltage VDD. The circuit and general operation thereof for the blind driver type over driving scheme are described in FIG. 1, those parts related to controlling of the blind driver type over driver will not be described.

The semiconductor memory device according to the present embodiment includes an over driving signal generation block 300, an external power supply voltage (VDD) level detection block 400, a selective output block 500, and an over driving block 600. The over driving signal generation block 300 generates an over driving signal OVDP that defines an over driving interval in response to an active command ACT. The VDD level detection block 400 detects a voltage level of the external power supply voltage VDD. The selective output block 500 selectively outputs an output signal OVDP_NEW using the over driving signal OVDP in response to a detection signal DET_VDD output from the VDD level detection block 400. The over driving block 600 is controlled by the output signal OVDP_NEW of the selective output block 500.

Figure 4:
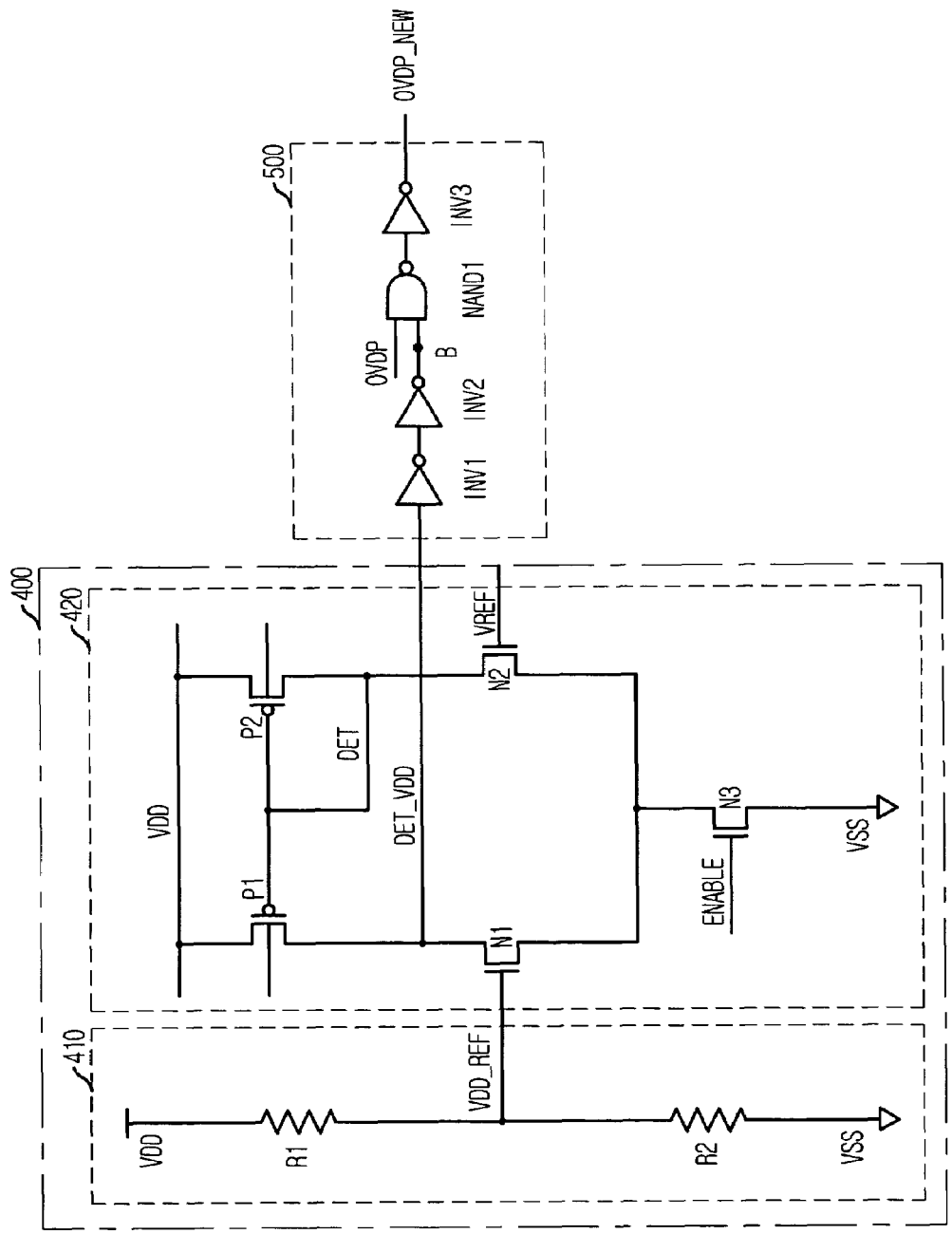
FIG. 4 is a circuit diagram of an external power supply voltage level detection block and a selective output block in accordance with an embodiment of the present invention.

FIG. 4 illustrates an exemplary circuit diagram of the VDD level detection block 400 and the selective output block 500 illustrated in FIG. 3.

The VDD level detection block 400 includes a level following unit 410 and a comparison unit 420. The level following unit 410 outputs a signal VDD_REF that changes linearly with respect to the external power supply voltage VDD. The comparison unit 420 compares the signal VDD_REF output from the level following unit 410 with a reference signal VREF.

The level following unit 410 includes first and second resistors R1 and R2 coupled in series between the external power supply voltage terminal and a ground voltage terminal. The level following unit 410 outputs the signal VDD_REF having a voltage, which is divided according to a resistance ratio of the first resistor R1 to the second resistor R2 or vice versa, as the corresponding voltage VDD_REF. For instance, if the first resistor R1 and the second resistor R2 have substantially the same resistance, the signal VDD_REF has a voltage level that is about ½ of the external power supply voltage VDD.

The comparison unit 420 includes a bias N-type channel metal-oxide semiconductor (NMOS) transistor N3, first and second P-type channel MOS (PMOS) transistors P1 and P2, and first and second input NMOS transistors N1 and N2. The bias NMOS transistor N3 has a gate receiving an enable signal ENABLE and is coupled to the ground voltage terminal. The first and second PMOS transistors P1 and P2 are coupled to the external power supply voltage terminal and form a current mirror circuit as gates of the first and second PMOS transistors P1 and P2 are coupled together. The first input NMOS transistor N1 is coupled between the first PMOS transistor P1 and the bias NMOS transistor N3, and the second input NMOS transistor N2 is coupled between the second PMOS transistor P2 and the bias NMOS transistor N3. The first and second PMOS transistors P1 and P2 receive the signal VDD_REF and the reference signal VREF, respectively. Supplying the enable signal ENABLE, the comparison unit 420 is enabled. The reference signal VREF has a constant voltage (e.g., about ½ of the external power supply voltage VDD) regardless of a change in a voltage level of the external power supply voltage VDD. The reference voltage VREF may be generated internally or externally.

The selective output block 500 includes first and second inverters INV1 and INV2, an NAND gate NAND1 and a third inverter INV3. The first and second inverters INV1 and INV2 are coupled in series and configured to buffer the detection signal DET_VDD output from the comparison unit 420. The NAND1 gate NAND1 receives the over driving signal OVDP and an output signal B of the second inverter INV2. The third inverter INV3 inverts an output signal of the NAND gate NAND1 and then outputs the inverted output signal as the output signal OVDP_NEW of the selective output block 500. On other words, the selective output block 500 performs an AND operation of the logic values of the detection signal DET_VDD and the over driving signal OVDP.

Figure 5B:
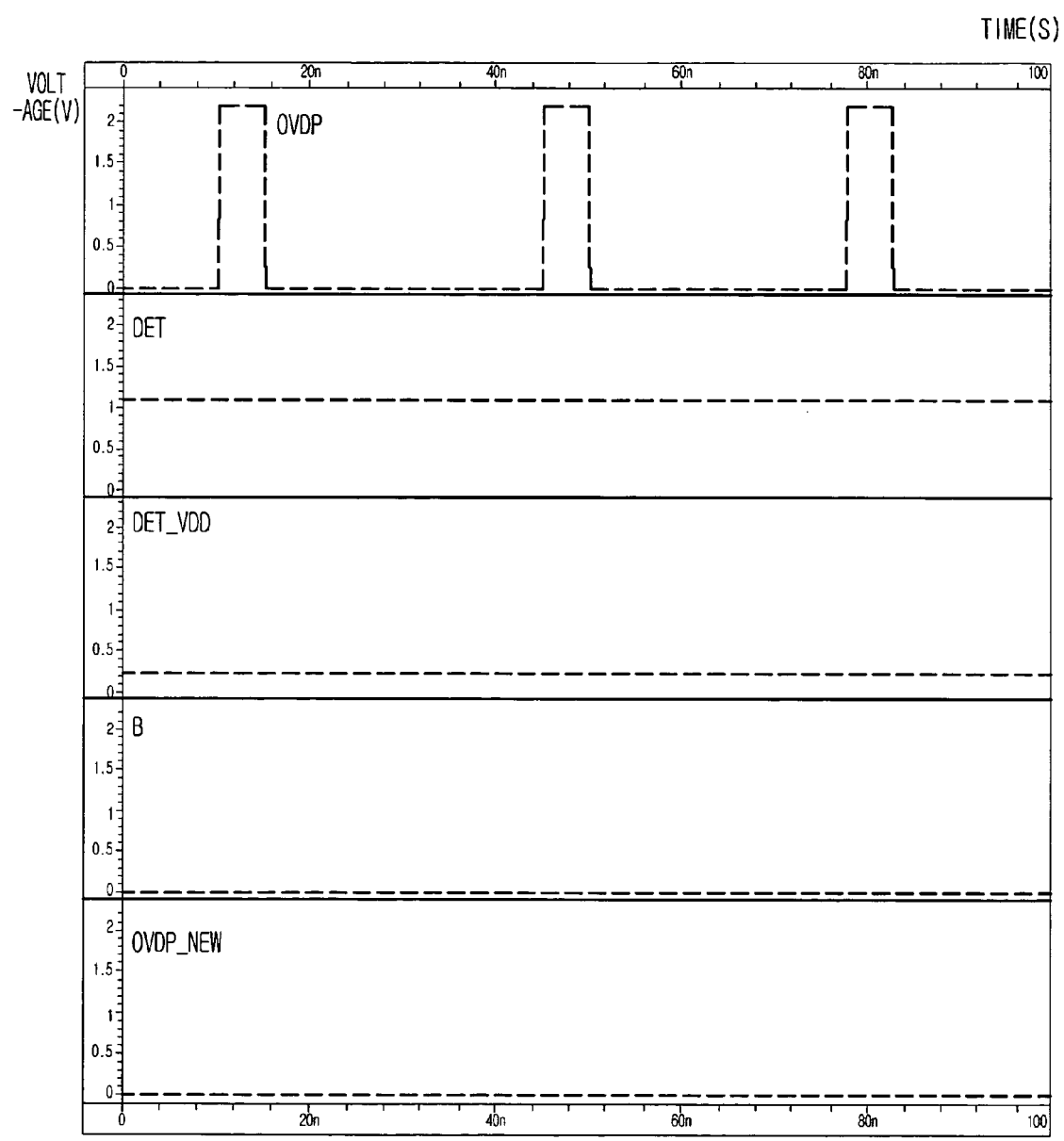

FIGS. 5A and 5B illustrate timing diagrams of the signals illustrated in FIG. 4.

FIG. 5A illustrates a waveform of the signals when the external power supply voltage VDD is low. A voltage level of the signal VDD_REF is determined by the voltage level of the external power supply voltage VDD, and thus, the external power supply voltage level is smaller than the reference voltage level. If the voltage level of the signal VDD_REF level is smaller than that of the signal VREF, the detection signal DET_VDD output from the comparison unit 420 is in a logic high state. As a result, the output signal OVDP_NEW of the selective output block 500 is in a logic high state. Since the external power supply voltage VDD is low, the core voltage VCORE can be maintained stably even if the bit line over driving operation is performed.

FIG. 5B illustrates a waveform of the signals when the external power supply voltage VDD is high. The voltage level of the signal VDD_REF is larger than that of the reference signal VREF. If the voltage level of the signal VDD_REF is larger than that of the reference signal VREF, the detection signal DET_VDD output from the comparison unit 420 is in a logic low state. As a result, the output signal OVDP_NEW of the selective output block 500 is in a logic low state. That is, the output signal OVDP_NEW becomes inactivated. As a result of the inactivation, the bit line over driving operation is not performed; rather, a normal driving operation is performed. Accordingly, an excessive increase in the voltage level of the core voltage VCORE, which is usually caused by the over driving operation performed under the condition of the high external power supply voltage VDD, can be reduced. Accordingly, operation characteristics and reliability of semiconductor memory devices can be improved.

The logic types and device layout described in the above embodiments are exemplary implementations when the input signals and output signals are activated as logic high levels. Thus, when the logic states of the signals are changed, the illustrated implementations are also changed. Thus, many other implementations are possible.

The resistors configured in the level following unit can be replaced with active devices such as PMOS or NMOS transistors. Although the selective output unit according to the exemplary embodiments is implemented to logically combine the detection signal and the over driving signal, it is possible to implement the logic that allows a selective output of the over driving signal such as using a latching device and a transmission gate outputting the over driving signal under the control of the detection signal.

Figure 6:
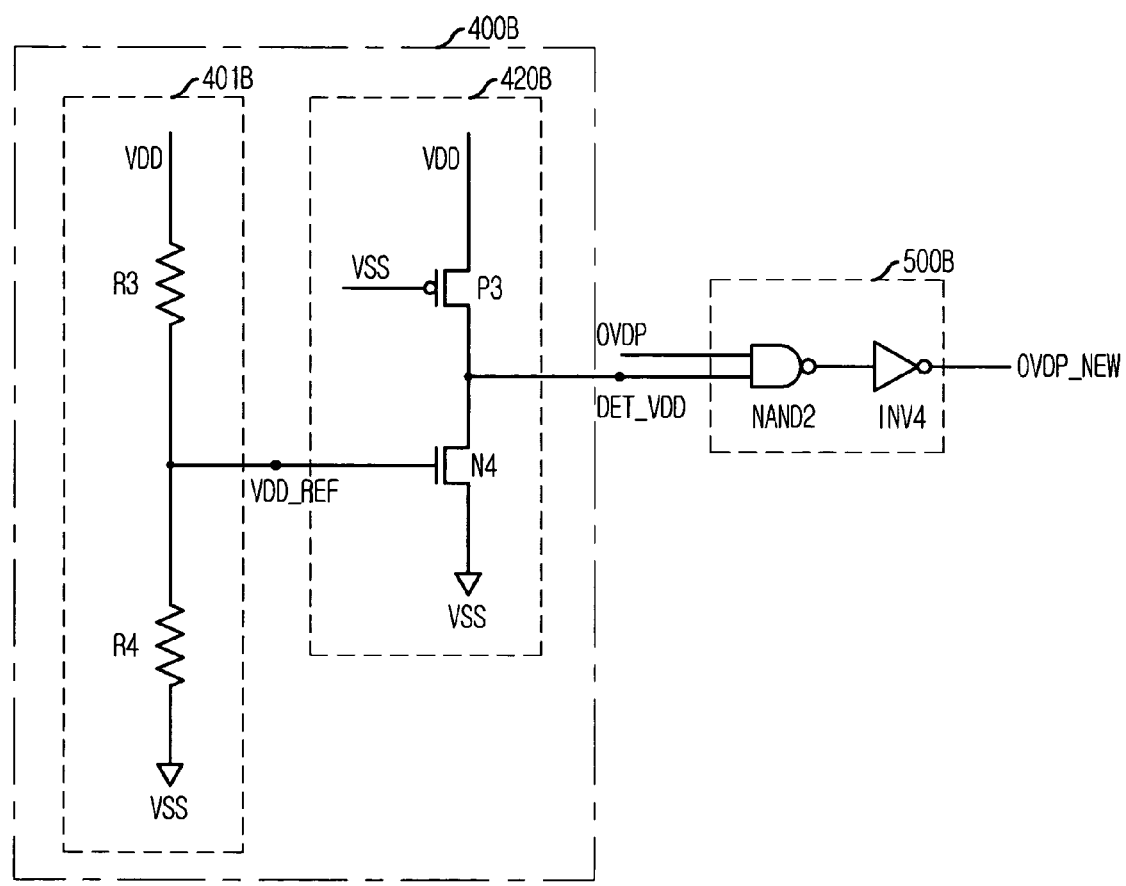
FIG. 6 is a simplified circuit diagram of an external power supply voltage level detection block and a selective output block in accordance with another embodiment of the present invention.

FIG. 6 illustrates another exemplary circuit diagram of a VDD level detection block 400B and a selective output block 500B in accordance with another embodiment of the present invention.

The VDD detection block 400B includes a level following unit 401B and a voltage level detection unit 420B. The level follower 401B is to output a corresponding voltage VDD_REF that changes linearly to an external power supply voltage VDD. The voltage level detection unit 420B is to detect whether the over driving voltage has a voltage level greater than a predetermined voltage level in response to the corresponding voltage VDD_REF of the level following unit 401B.

The level following unit 401B includes first and second resistors R3 and R4 that are coupled in series between a terminal of the external power supply voltage VDD and a terminal of a ground voltage VSS. The level following unit 401B outputs a voltage that is divided according to a resistance ratio of the first resistor R3 to the second resistor R4 or vice versa through a common node between the first and second resistors R3 and R4. This output voltage is the corresponding voltage VDD_REF. For instance, if the first and second resistors R3 and R4 have substantially the same resistance value, the corresponding voltage VDD_REF has a voltage level that is approximately one half of the external power supply voltage VDD.

The voltage level detection unit 420B includes an NMOS transistor N4 and a PMOS transistor P3. The NMOS transistor N4 has a gate to which the corresponding voltage VDD_REF is supplied, and is coupled to the terminal of the ground voltage. The PMOS transistor P3 has a gate to which the ground voltage is supplied, and is coupled to the terminal of the external power supply voltage VDD.

The selective output block 500B includes an NAND gate NAND2 and an inverter INV4. The NAND gate NAND2 receives an output signal DET_VDD and an over driving signal OVDP of the voltage level detection unit 420B. The inverter INV4 inverts an output signal of the NAND gate NAND2 and outputs the inverted signal as an output signal OVDP_NEW of the selective output block 500B.

Figure 7A:
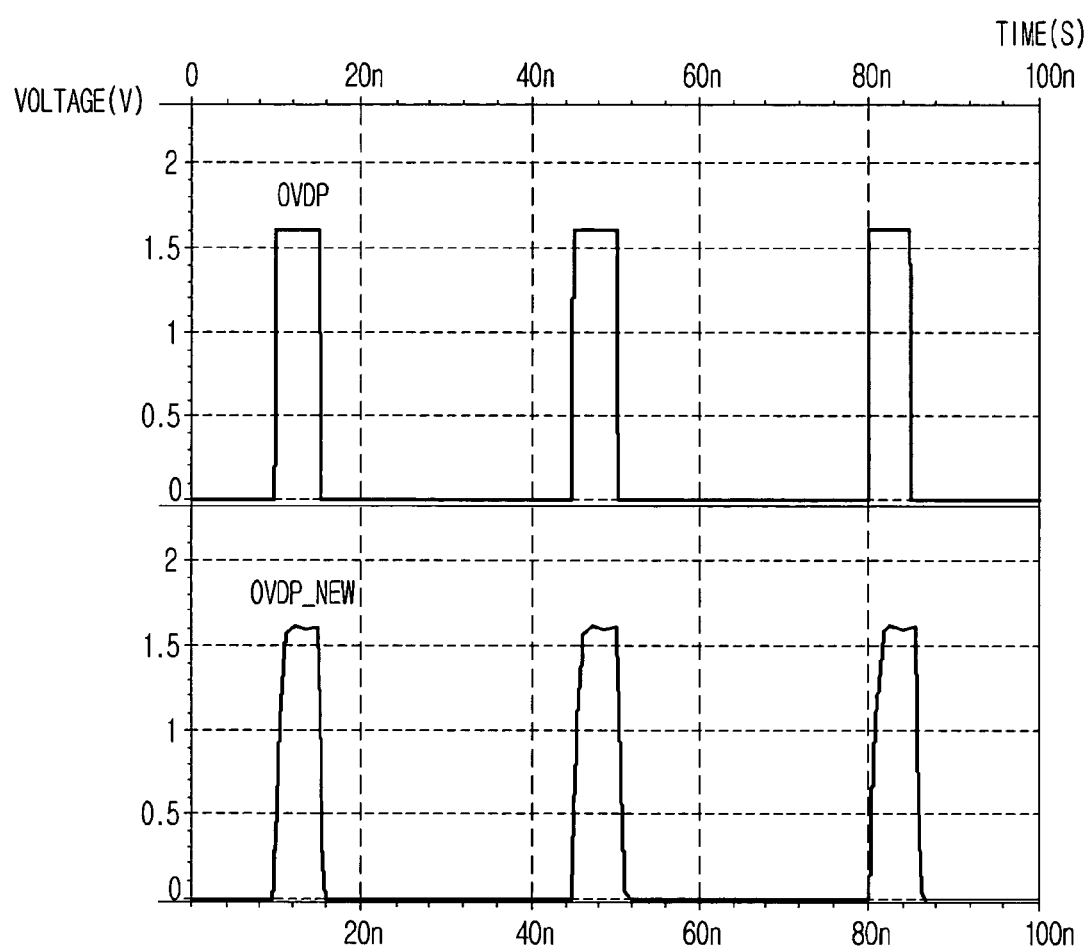
FIGS. 7A and 7B are timing diagrams of the circuit illustrated in FIG. 6.
Figure 7B:
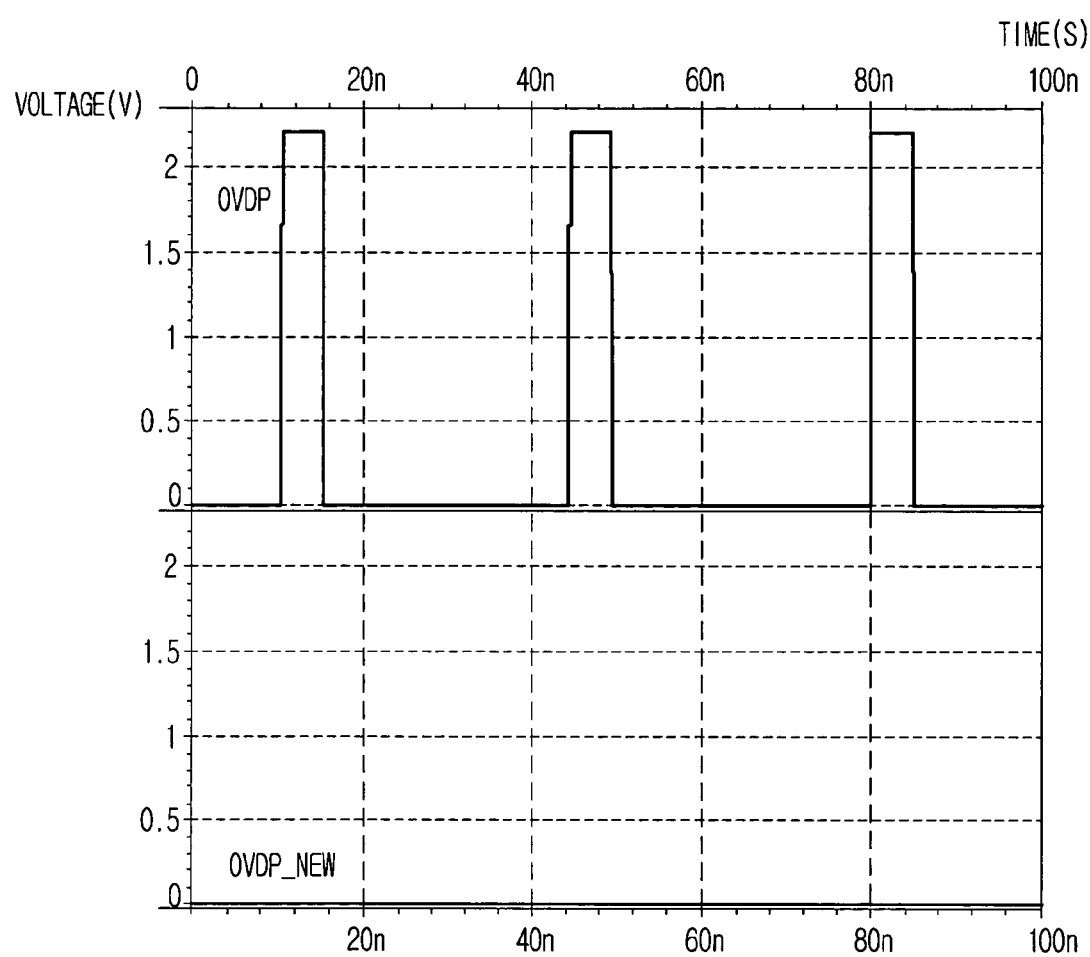

FIGS. 7A and 7B illustrate timing diagrams of the signals illustrated in FIG. 6.

FIG. 7A is a waveform of the signals when over driving toward the power supply voltage is necessary due to the fact that a voltage level of the external power supply voltage VDD is not much different from a voltage level of a core voltage. The over driving signal OVDP has a voltage level of the power supply voltage. As illustrated, the voltage level of the over driving signal OVDP is approximately 1.6 V, and this value is not much different from the typically known voltage level of the core voltage (i.e., approximately 1.5 V).

The corresponding voltage VDD_REF is outputted through the level following unit 401B, and then inputted to the voltage level detection unit 420B. The output signal DET_VDD of the voltage level detection unit 420B has a logic high because the NMOS transistor N4 of the voltage level detection unit 420B cannot turn on due to a threshold voltage level of the NMOS transistor N4. As a result, the selective output block 500B outputs the over driving signal OVDP as the output signal OVDP_NEW. Hence, a normal bit line over driving operation is performed. Since the external power supply voltage VDD is low, the voltage level of the core voltage can be maintained stably even if the bit line over driving operation is performed.

FIG. 7B is a waveform of the signals when the over driving toward the power supply voltage is not necessary since the power supply voltage and the core voltage have different voltage levels from each other to a great extent. The over driving signal OVDP has a voltage level of the external power supply voltage VDD. For instance, in this embodiment, the voltage level of the over driving signal OVDP is approximately 2.2 V, and this voltage level is different from the typically known voltage level of the core voltage (i.e., approximately 1.5 V).

The level following unit 401B outputs the corresponding voltage VDD_REF, which is subsequently inputted to the voltage level detection unit 420B. Since the corresponding voltage VDD_REF has a voltage level that is greater than the threshold voltage level of the NMOS transistor N4, the NMOS transistor N4 turns on. Therefore, the output signal DET_VDD of the voltage level detection unit 420B has a logic low. As a result, the selective output block 500B blocks the over driving signal OVDP, thereby disabling the output signal OVDP_NEW as a logic low. In this case, the bit line over driving operation is skipped, and a normal driving operation is performed instead. Thus, the external power supply voltage VDD triggers the over driving under the high voltage level. As a result, the voltage level of the core voltage does not increase to a great extent.

In the above exemplary embodiments, the core voltage VCORE and the over driving voltage are used as a normal driving voltage and an over driving voltage, respectively. Other types of voltage can also be used for the normal driving voltage and the over driving voltage.

The present application contains subject matter related to the Korean patent application Nos. KR 2005-0090837, 2005-0090911, 2005-0132504, and 2005-0132586, filed in the Korean Patent Office respectively on Sep. 28, 2005, and Sep. 29, Dec. 28, 2005, and Dec. 28, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A semiconductor memory device, comprising:
a bit line sense amplifying block to sense and amplify data on bit lines;
a first driving block to drive a pull up power line of the bit line sense amplifying block using a voltage applied to a normal driving voltage terminal;
a second driving block to drive the normal driving voltage terminal using an over driving voltage;
an over driving signal generation block to generate an over driving signal that defines an over driving interval in response to an active command;
an external power supply voltage detection block to detect a voltage level of an external power supply voltage; and
a selective output block to selectively output the over driving signal in response to an output signal of the external power supply voltage level detection block, wherein an output signal of the selective output block controls the second driving block.

2. The semiconductor memory device of claim 1, wherein the normal driving voltage terminal includes a core voltage terminal, and the over driving voltage is the external power supply voltage.

3. The semiconductor memory device of claim 1, wherein the external power supply voltage level detection block comprises: a level following unit to output a corresponding voltage changing linearly to the external power supply voltage; and a comparison unit to compare the corresponding voltage with a reference voltage.

4. The semiconductor memory device of claim 3, wherein the level following unit comprises first and second resistors coupled in series between a terminal of the external power supply voltage and a terminal of a ground voltage, and outputs a voltage divided according to a resistance ratio between the first resistor and the second resistor as the corresponding voltage, the voltage outputted through a common node between the first resistor and the second resistor.

5. The semiconductor memory device of claim 3, wherein the comparison unit comprises:
a bias N-type channel metal-oxide semiconductor (NMOS) transistor receiving an enable signal through a gate thereof and coupled to the ground voltage terminal;
first and second P-type channel metal-oxide semiconductor (PMOS) transistors coupled to the external power supply voltage terminal and forming a current mirror system as gates of the first and second PMOS transistors are coupled together; and
a first input NMOS transistor coupled between the first PMOS transistor and the bias NMOS transistor and receiving the corresponding voltage; and a second input NMOS transistor coupled between the second PMOS transistor and the bias NMOS transistor and receiving the reference voltage.

6. The semiconductor memory device of claim 1, wherein the external power supply voltage level detection block comprises:
a level following unit to output a corresponding voltage changing linearly to the external power supply voltage; and
a voltage level detection unit to detect whether the over driving voltage has a voltage level greater than a predetermined voltage level in response to the corresponding voltage.

7. The semiconductor memory device of claim 6, wherein the level following unit comprises first and second resistors coupled in series between a terminal of the external power supply voltage and a terminal of a ground voltage, and outputs a voltage that is divided according to a resistance ratio between the first resistor and the second resistor as the corresponding voltage, the voltage outputted through a common node between the first resistor and the second resistor.

8. The semiconductor memory device of claim 6, wherein the voltage level detection unit comprises:
an NMOS transistor having a gate to which the corresponding voltage is supplied and coupled to the terminal of the ground voltage; and
a PMOS transistor having a gate to which the ground voltage is supplied and coupled to the terminal of the external power supply voltage.

9. The semiconductor memory device of claim 1, wherein the selective output block comprises a logic device that performs a logical multiplication of the over driving signal and the output signal of the comparison unit.

10. The semiconductor memory device of claim 9, wherein the selective output block comprises:
   a first inverter and a second inverter coupled in series and buffering the output signal of the comparison unit;
   an NAND gate receiving the over driving signal and an output signal of the second inverter; and
   a third inverter inverting an output signal of the NAND gate and outputting the inverted output signal as the output signal of the selective output block.

11. The semiconductor memory device of claim 9, wherein the selective output block comprises:
   an NAND gate receiving an output signal of the voltage level detection unit and the over driving signal; and
   an inverter inverting an output signal of the NAND gate and outputting the inverted signal as the output signal of the selective output block.

12. The semiconductor memory device of claim 9, wherein the selective output block comprises:
   a transmission gate to output the over driving signal under the control of the output signal of the comparison unit; and
   a latching device to latch an output signal of the transmission gate.

13. A driving method of a semiconductor memory device comprising:
   driving a pull up power line of a bit line sense amplifying block using a voltage applied to a normal driving voltage terminal;
   generating an over driving signal that defines an over driving interval in response to an active command;
   detecting a voltage level of an external power supply voltage to selectively output the over driving signal;
   selectively outputting the over driving signal in response to the detection result, wherein if the over driving voltage is lower than a predetermined voltage, the over driving signal is enabled, and if the over driving voltage is higher than the predetermined voltage, the over driving signal is disabled; and
   driving the normal driving voltage terminal using the over driving voltage in response to the over driving signal.

14. The driving method of claim 13, wherein the normal driving voltage terminal includes a core voltage terminal, and the over driving voltage is the external power supply voltage.

15. The driving method of claim 13, wherein detecting the voltage level of the external power supply voltage to selectively output the over driving signal comprises:
   outputting a corresponding voltage changing linearly to the external power supply voltage; comparing the corresponding voltage with a reference voltage; and
   selectively outputting the over driving signal according to the comparison result.

16. The driving method of claim 15, wherein selectively outputting the over driving signal according to the comparison result comprises logically multiplying the comparison result with the over driving signal.

17. The driving method of claim 13, wherein detecting the voltage level of the external power supply voltage to selectively output the over driving signal comprises:
   outputting a corresponding voltage changing linearly to the external power supply voltage;
   detecting whether the over driving voltage has a voltage level greater than a predetermined voltage level in response to the corresponding voltage; and
   selectively outputting the over driving signal according to the detection result.

18. The driving method of claim 17, wherein selectively outputting the over driving signal according to the detection result comprises logically multiplying the detection result with the over driving signal.

* * * * *